(12) United States Patent
Park et al.

(10) Patent No.: US 12,721,004 B2
(45) Date of Patent: Aug. 25, 2026

(54) DISPLAY DEVICE AND METHOD OF FABRICATING THE SAME

(71) Applicant: LG Display Co., Ltd., Seoul (KR)

(72) Inventors: Hye-Jeong Park, Paju-si (KR); Seung-Un Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 819 days.

(21) Appl. No.: 17/971,404

(22) Filed: Oct. 21, 2022

(65) Prior Publication Data

US 2023/0200117 A1 Jun. 22, 2023

(30) Foreign Application Priority Data

Dec. 22, 2021 (KR) ........................ 10-2021-0185339

(51) Int. Cl.

*H10K 59/12* (2023.01)
*H10K 59/38* (2023.01)
*H10K 59/40* (2023.01)
*H10K 59/80* (2023.01)
*H10K 71/00* (2023.01)

(52) U.S. Cl.

CPC ........... *H10K 59/873* (2023.02); *H10K 59/12* (2023.02); *H10K 59/38* (2023.02); *H10K 59/40* (2023.02); *H10K 59/879* (2023.02); *H10K 71/00* (2023.02); *H10K 59/1201* (2023.02)

(58) Field of Classification Search

None

See application file for complete search history.

(56) References Cited

U.S. PATENT DOCUMENTS

2016/0154259 A1* 6/2016 Kim .................. G02F 1/133711 349/33
2020/0160023 A1* 5/2020 Hu ...................... G02F 1/13338
2021/0063785 A1* 3/2021 Kim ...................... G02F 1/1334
2021/0074779 A1* 3/2021 Park ..................... H10K 59/126

FOREIGN PATENT DOCUMENTS

KR 10-2011-0054765 A 5/2011
KR 10-2016-0066400 6/2016
KR 10-2020-124804 11/2020
KR 10-2021-0036000 A 4/2021

OTHER PUBLICATIONS

English translation of CN 105762173 (Year: 2016).*

* cited by examiner

*Primary Examiner* — Xiaoming Liu

(74) *Attorney, Agent, or Firm* — Birch, Stewart, Kolasch & Birch, LLP

(57) ABSTRACT

The present disclosure relates to a display device comprising a substrate including a plurality of sub-pixels, a thin film transistor and a light emitting element on the substrate, an encapsulation layer on the substrate and covering the light emitting element, and a light control layer disposed on the light emitting element and including a liquid crystal monomer and a dichroic dye. The dichroic dye in a boundary region between the sub-pixels has a black color to absorb a light.

13 Claims, 13 Drawing Sheets

FIG. 3

DISPLAY DEVICE AND METHOD OF FABRICATING THE SAME

CROSS-REFERENCE TO RELATED APPLICATIONS

The present application claims the priority benefit to Korean Patent Application No. 10-2021-0185339, filed in the Republic of Korea on Dec. 22, 2021, the contents of which are hereby expressly incorporated by reference in its entirety into the present application.

BACKGROUND

Field of Technology

The present disclosure relates to a display device, and more particularly, to a display device having improved luminance and a method of fabricating the same.

Discussion of the Related Art

Recently, with the development of multimedia, the importance of a flat panel display device is increasing, and flat panel display devices, such as a liquid crystal display device, a plasma display device, and an organic light emitting display device, are being commercialized. Among these flat panel display devices, the organic light emitting display device is currently widely used because of a high response speed, a high luminance and a good viewing angle.

In the organic light emitting display device, a polarizing plate is attached to a front surface of a display panel to prevent visibility by an external light reflection. However, the luminance of the organic light emitting display device can be decreased by the polarizing plate, and the thickness of the organic light emitting display device can be increased by the polarizing plate. In addition, in a foldable display device, the foldable property can be degraded by the polarizing plate.

SUMMARY OF THE DISCLOSURE

The embodiments of the present disclosure are directed to a display device and a method of fabricating the same that substantially obviate one or more of the limitations and disadvantages of the related art.

An object of the present disclosure is to provide a display device and a method of fabricating the same, which are capable of minimizing or eliminating an external light reflection without using a polarizing plate.

Another object of the present disclosure is to provide a display device and a method of fabricating the same, which are capable of preventing a color mixing by the external light reflection into a sub-pixel.

Another object of the present disclosure is to provide a display device and a method of fabricating the same, which are capable of preventing stain by a diffuse reflection on an electrode.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an aspect of the present disclosure is a display device comprising a substrate including a plurality of sub-pixels, a thin film transistor and a light emitting element on the substrate, an encapsulation layer on the substrate and covering the light emitting element, and a light control layer disposed on the light emitting element and including a liquid crystal monomer and a dichroic dye. The dichroic dye in a boundary region between the sub-pixels has a black color to absorb a light.

Another aspect of the present disclosure is a method of fabricating a display device comprising preparing a substrate including a plurality of sub-pixels, forming a thin film transistor and a light emitting element on the substrate, forming an encapsulation layer on the light emitting element, forming a light control layer including a liquid crystal monomer and a dichroic dye, and irradiating a light to the light control layer in a boundary region between adjacent sub-pixels so that the dichroic layer is converted to black.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

FIG. 3 is a cross-sectional view of a display device according to a first embodiment of the present disclosure.

DETAILED DESCRIPTION OF THE EMBODIMENTS

Figure 1A:
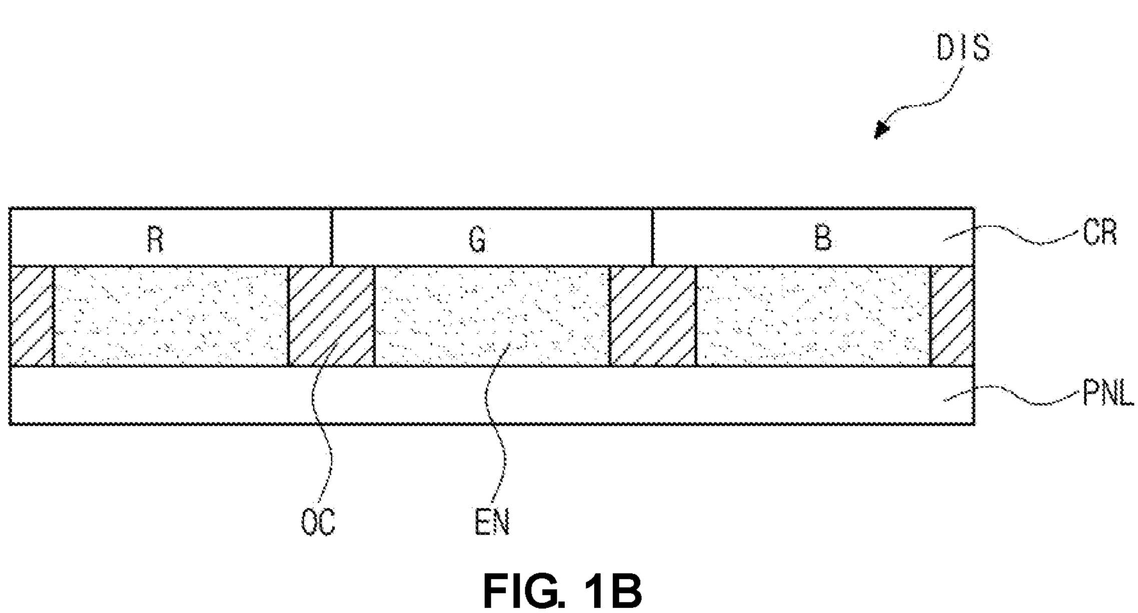
FIGS. 1A to 1D are schematic cross-sectional view of a display device according to embodiments of the present disclosure.

Advantages and features of the present invention and methods of achieving them will be apparent with reference to the embodiments described below in detail with the accompanying drawings. However, the present invention is not limited to the embodiments disclosed below, but can be realized in a variety of different forms, and only these embodiments allow the disclosure of the present invention to be complete. The present invention is provided to fully inform the scope of the invention to the skilled in the art of the present invention, and the present invention is only defined by the scope of the claims.

The shapes, sizes, proportions, angles, numbers, and the like disclosed in the drawings for explaining the embodiments of the present invention are illustrative, and the present invention is not limited to the illustrated matters. The same reference numerals refer to the same elements throughout the specification. In addition, in describing the present invention, if it is determined that a detailed description of the related known technology unnecessarily obscure the subject matter of the present invention, the detailed description thereof can be omitted or may be briefly described. When 'including', 'having', 'consisting', and the like are used in this specification, other parts can be added unless 'only' is used. When a component is expressed in the singular, cases including the plural are included unless specific statement is described.

In interpreting the components, even if there is no separate explicit description, it is interpreted as including a margin range.

In the case of a description of the positional relationship, for example, when the positional relationship of two parts is described as 'on', 'over', 'under', 'next to', and the like, one or more other parts can be positioned between two parts unless 'right', or 'directly' is described.

In the case of a description of a temporal relationship, for example, when the temporal relationship is described as 'after', 'following', 'after', 'before', and the like, it includes cases that are not continuous unless 'immediately' or 'directly' is described.

Although the first, second, etc. are used to describe various elements, these elements are not limited by these terms. These terms are only used to distinguish one element from another element. Accordingly, the first element mentioned below can be the second element within the spirit of the present invention.

In describing the components of the present disclosure, terms such as first, second, A, B, (a), (b), etc. can be used. These terms are only for distinguishing the elements from other elements, and the essence, order, order, or number of the elements are not limited by the terms. When it is described that an element is "connected", "coupled" or "connected" to another element, the element can be directly connected or connected to the other component, but it should be understood that other element(s) can be "interposed" between the elements or the elements can be "connected", "coupled" or "connected" through other component.

In the present disclosure, a "display device" can include a liquid crystal module (LCM), an organic light emitting module (OLED Module), and a quantum dot module including a display panel and a driving unit for driving the display panel. In addition, a "display device" can include a complete product or final product including an LCM, an OLED module, a QD (quantum dot) module, such as a notebook computer, a television, a computer monitor, an equipment display apparatus, e.g., an automotive display apparatus or other form of a vehicle, a mobile electronic apparatus, e.g., a smart phone or an electronic pad. These final products can be referred to as a set device or a set apparatus.

Accordingly, the display device in the present disclosure can include the display device in a narrow definition, such as LCM, OLED module, QD module, or the like, and the set device, which is an application product or end-user device including LCM, OLED module, QD module, or the like.

Reference will now be made in detail to some of the examples and preferred embodiments, which are illustrated in the accompanying drawings. All components of each display device according to all embodiments of the present disclosure are operatively coupled and configured.

FIGS. 1A to 1D are schematic cross-sectional view of a display device DIS according to embodiments of the present disclosure.

As shown in FIG. 1A, the display device DIS according to the present disclosure includes a display panel PNL, an encapsulation layer EN covering the display panel PNL, a color filter layer CR disposed on the encapsulation layer EN, and a light control layer OC disposed inside the encapsulation layer EN. The display device DIS can include other components for displaying images, such as drivers, circuitry, etc.

The display panel PNL is an organic light emitting display panel, and the encapsulation layer EN seals the organic light emitting display panel PNL to prevent the defect in a light emitting layer of the organic light emitting display panel PNL by blocking the penetration of foreign substances such as moisture or air. As will be described later, the encapsulation layer EN can have a multi-layered structure including at least one inorganic layer (or film) and at least one organic layer. The display panel PNL is not limited to the organic light emitting display panel and can be a quantum dot display panel or a micro-LED display panel. The color filter layer CR includes R, G and B color filters and filters the image output from the display panel PNL by wavelength to realize a vivid color image.

A structure in which the color filter layer CR is disposed on the encapsulation layer EN of the display device DIS can be referred to as a COE (color filter on encapsulation) structure.

In the display device DIS of the COE structure ("COE display device"), the R, G and B color filters of the color filter layer CR absorb most of the external light (or ambient light) and transmit only the light of the corresponding wavelength to the inside of the display panel PNL. In addition, since the light reflected from the inside of the display panel PNL is partially absorbed by the color filter layer CR and is partially transmitted through the color filter layer CR, the external light reflection can be minimized.

In other words, in the COE display device DIS according to the present disclosure, since the external light reflection can be minimized by providing the color filter layer CR on the encapsulation layer EN, the visibility of the display device DIS can be improved without having a polarizing plate. Accordingly, since the polarizing plate is not needed, the manufacturing cost can be reduced and the thickness of the display device DIS can be reduced.

In the display device DIS of the present disclosure, the light control layer OC is disposed inside the encapsulation layer EN. The light control layer OC has a pattern shape. The light control layer OC controls the light output of the image output from the display panel PNL. The light control layer OC absorbs an image being obliquely output at a predetermined angle with the upper surface of the display panel PNL so that the image display at a unintended area is prevented. Accordingly, the image quality of the display panel PNL is improved.

The light output of the external light reflected by the display panel PNL is controlled by the light control layer OC, and the control of the light output can prevent stain or spot on the screen by the diffuse reflection inside the display panel PNL.

The light input to the display panel PNL from the outside is reflected by a metal pattern such as various line (e.g., wirings) or metal patterns inside the display panel PNL and is output to the outside of the display panel PNL. As a result, the visibility of the display device DIS can be decreased. Since the external light incident on the metal pattern is diffusely reflected in various directions, the light reflected from the inside of the display panel PNL and transmitted through a specific sub-pixel (e.g., R-sub-pixel) is transmitted to and output from an adjacent sub-pixel (e.g., R-sub-pixel, B-sub-pixel and/or G-sub-pixel). As a result, since the color of the adjacent sub-pixel is displayed instead of the corresponding color in a specific sub-pixel, the stain defect by the color mixing may occur on the screen.

To address this, in the display device DIS of the present disclosure, since the light control layer OC is provided to block the light diffusely reflected inside the display panel PNL from being output to the adjacent sub-pixels, the occurrence of stain (or spot) defect can be prevented. As will be described later, the light control layer OC can block light input in a specific direction (or at a specific angle) to prevent stain by the diffuse reflection.

Figure 1B:
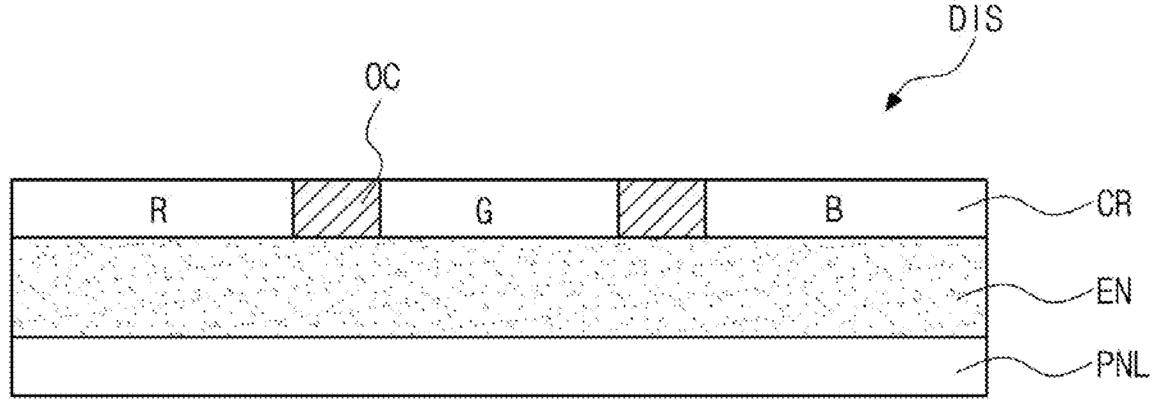

Referring to FIG. 1B, in the display device DIS according to the embodiment of the present disclosure, the color filter layer CR is disposed on the encapsulation layer EN, and the light control layer OC is disposed between the color filters in the color filter layers CR. Like the display device DIS explained with FIG. 1A, the display device DIS of FIG. 1B also controls the light, which is reflected from the inside of the display panel PNL and passes through the color filter layer CR, to prevent the occurrence of spots on the screen.

Figure 1C:
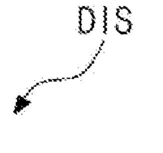
Figure 1C:
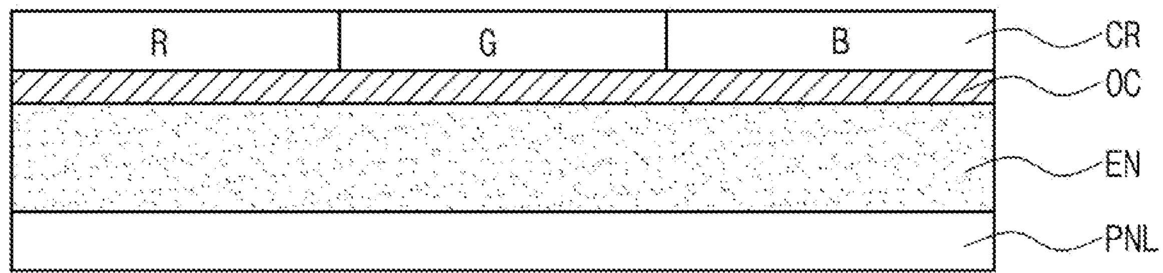

Referring to FIG. 1C, in the display device DIS according to the embodiment of the present disclosure, the color filter layer CR is disposed over the encapsulation layer EN, and the light control layer OC is disposed between the encapsulation layer EN and the color filter layer CR. In this case, the light control layer OC has a film shape (or a layer shape) to correspond to an entire surface of the display panel PNL. The display device DIS of FIG. 1C also controls the light, which is reflected from the inside of the display panel PNL and passes through the color filter layer CR, to prevent the occurrence of spots on the screen.

Figure 1D:
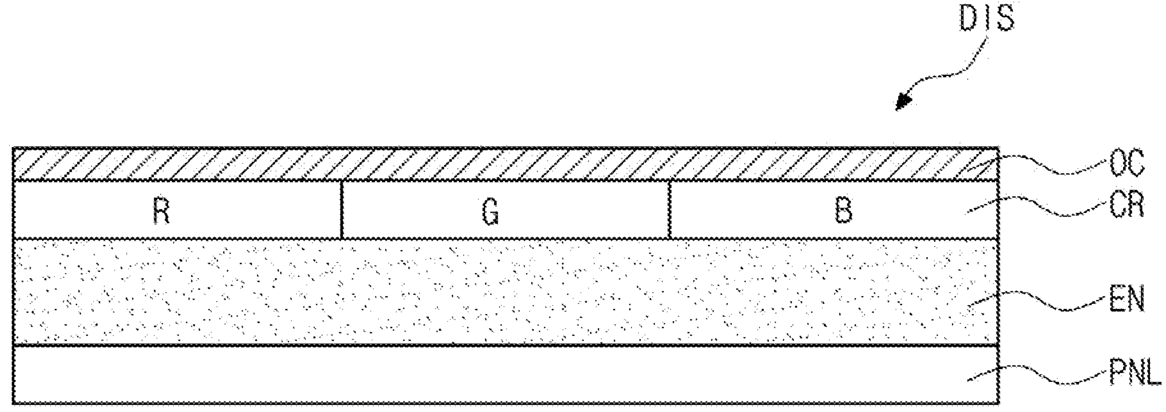

Referring to FIG. 1D, in the display device DIS according to the embodiment of the present disclosure, the color filter layer CR is disposed on the encapsulation layer EN, and the light control layer OC is disposed on the color filter layer CR. The display device DIS of FIG. 1D also controls the light, which is reflected from the inside of the display panel PNL and passes through the color filter layer CR, to prevent the occurrence of spots on the screen.

According to the embodiments of the present disclosure, by disposing the color filter layer CR, the reflection of the external light can be decreased without using a polarizing plate. In addition, by providing the light control layer OC, the problem of spot on the screen by the diffuse reflection can be prevented. Moreover, since a portion of the light diffusely reflected is blocked by the light control layer OC, the reflection of the external light can be further decreased.

Figure 2:
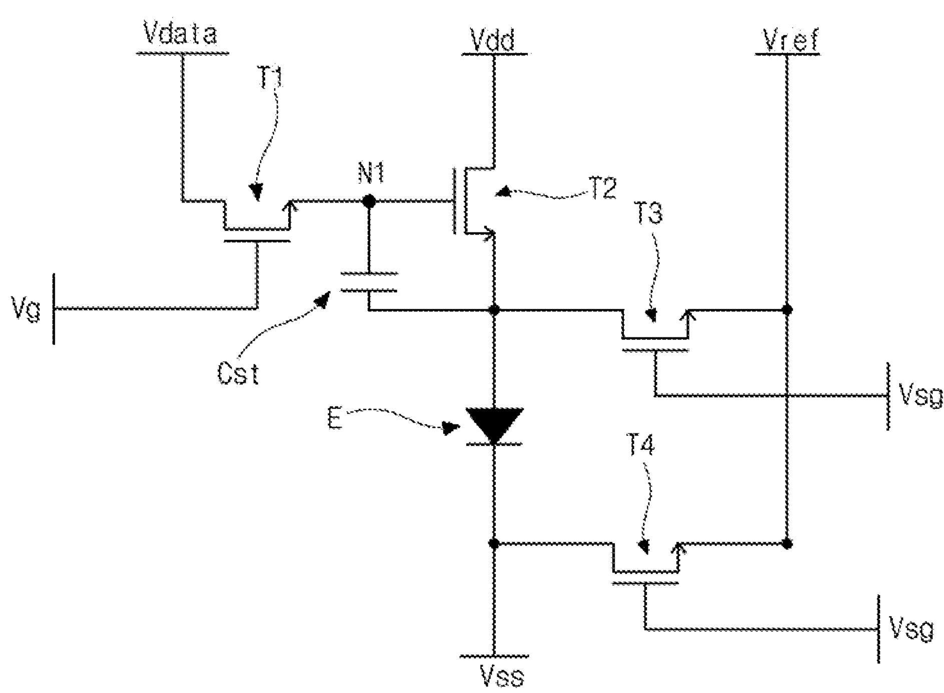
FIG. 2 is a schematic circuit diagram of a display panel in a display device according to an embodiment of the present disclosure.

FIG. 2 is a schematic circuit diagram of a display panel in a display device according to an embodiment of the present disclosure. An organic light emitting display panel as an example of the display panel is explained.

The display panel PNL according to the present disclosure can include a display area and a pad area. The display area includes a plurality of sub-pixels SP. Each sub-pixel SP displays a single color in the organic light emitting display device. For example, each sub-pixel SP displays any one of red, green, blue, and white colors. In this case, the red, green, blue, and white sub-pixels SP can be one pixel. The plurality of sub-pixels SP can be arranged in a matrix on the substrate of the organic light emitting display device, and a plurality of lines can be disposed between the plurality of sub-pixels SP in the display area.

In addition, various lines, which are electrically connected to the lines in the display area and apply signals to the light emitting elements of the display device, can be disposed in the pad area. For example, the lines in the pad area can include a Vdd line, a Vdata line, a reference line (e.g., a Vref line), and a Vss line, but it is not limited thereto.

As shown in FIG. 2, each sub-pixel SP of the display panel PNL includes a switching thin film transistor T1, a driving thin film transistor T2, a storage capacitor Cst, a sensing thin film transistor T3, an auxiliary thin film transistor T4, and a light emitting element E. Since the sub-pixel SP includes four thin film transistors and one capacitor, it can be referred to as a 4T1C structure. The structure of the sub-pixel SP of the display device is not limited thereto. For example, the sub-pixel SP of the display device can have a 4T2C structure including four thin film transistors and two capacitors, a 5T2C structure including five thin film transistors and two capacitors, a 6T2C structure including six thin film transistors and two capacitors or a 7T2C structure including seven thin film transistors and two capacitors with various compensation structures.

Each of the four thin film transistors included in the sub-pixel SP includes a semiconductor layer, a gate electrode, a source electrode, and a drain electrode, and can be a P-type thin film transistor or an N-type thin film transistor. FIG. 2 shows an N-type thin film transistor for convenience of explanation.

The switching thin film transistor T1 includes a source electrode connected to a data line, a drain electrode connected to a first node N1 and a gate electrode connected to the gate line. The switching thin film transistor T1 is turned on based on the gate voltage Vg, which is applied from the gate driver to the gate line, so that the data voltage Vdata, which is applied from the data driver to the data line, is charged to the first node N1.

The driving thin film transistor T2 includes a source electrode connected to a high potential line, e.g., the Vdd line, a drain electrode connected to a first electrode of the light emitting element E, and a gate electrode connected to the first node N1. The driving thin film transistor T2 is turned on when the voltage of the first node N1 is higher than a threshold voltage Vth, and is turned off when the voltage of the first node N1 is lower than the threshold voltage. The driving current received from the Vdd line is transferred to the light emitting element E by the driving thin film transistor T2.

The storage capacitor Cst includes an electrode connected to the first node N1 and an electrode connected to the drain electrode of the driving thin film transistor T2. The storage capacitor Cst maintains a potential difference between the gate electrode and the source electrode of the driving thin film transistor T2 during an emission time of the light emitting element E so that a constant driving current is transmitted to the light emitting device E.

The sensing thin film transistor T3 includes a source electrode connected to the drain electrode of the driving thin film transistor T2, a drain electrode connected to a reference line, and a gate electrode connected to a sensing gate line providing a sensing gate voltage Vsg. The sensing thin film transistor T3 is a thin film transistor for sensing the threshold voltage of the driving thin film transistor T2.

The auxiliary thin film transistor T4 includes a source electrode electrically connected to a second electrode of the light emitting element E, a drain electrode electrically connected to the reference line, and a gate electrode electrically connected to an auxiliary gate line providing a sensing gate voltage Vsg. The auxiliary thin film transistor T4 is turned on in the light emitting section and transmits a low potential voltage, e.g., Vss, to the second electrode of the light emitting device E.

Figure 3:
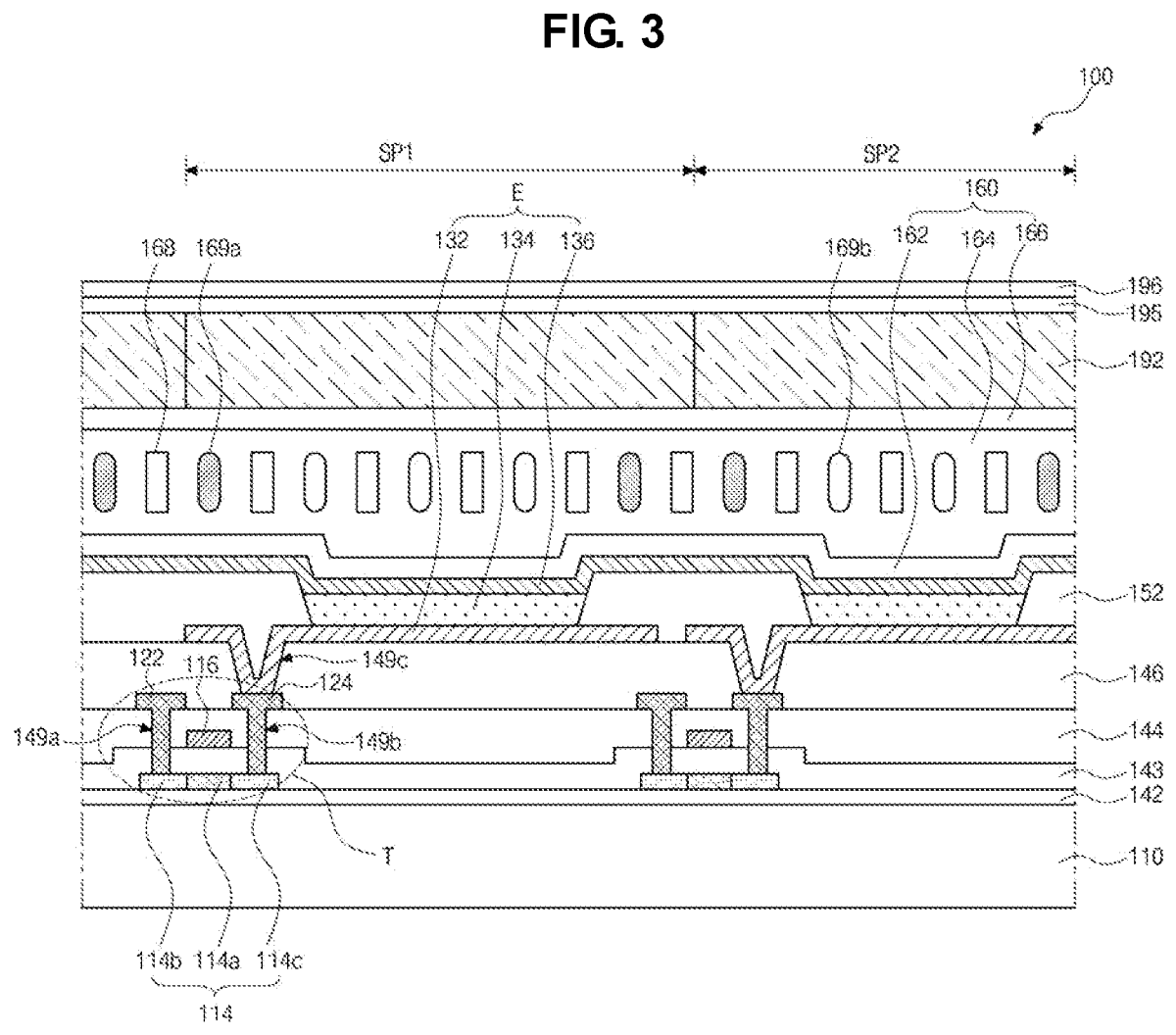

FIG. 3 is a cross-sectional view of a display device according to a first embodiment of the present disclosure. For convenience of explanation, two adjacent sub-pixels SP1 and SP2 are shown in FIG. 3, but the display device includes a plurality of sub-pixels and other components for display images.

As shown in FIG. 3, a display device 100 according to the first embodiment of the present disclosure includes the plurality of sub-pixels SP1 and SP2 disposed on a substrate 110. The sub-pixels SP1 and SP2 can be R, G, and B sub-pixels displaying red, blue, and green colors, or can be R, G, B, W sub-pixels displaying red, blue, green, and white colors.

The thin film transistor T is disposed in each of the sub-pixels SP1 and SP2. In each of the sub-pixels SP1 and SP2, various thin film transistors, such as the switching thin film transistor, the driving thin film transistor, the sensing thin film transistor and the auxiliary thin film transistor, are disposed. However, for convenience of explanation, one thin film transistor T is shown in FIG. 3.

For example, the switching thin film transistor, the driving thin film transistor, the sensing thin film transistor and the auxiliary thin film transistor can have the same structure as the thin film transistor T.

The thin film transistor T includes a semiconductor layer 114, a gate electrode 116, a source electrode 122 and a drain electrode 124. The semiconductor layer 114 is disposed on a buffer layer 142, which is formed on the substrate 110, and under a gate insulating layer 143. The buffer layer 142 can be omitted. Namely, the semiconductor layer 114 can be disposed on or over the substrate 110. The gate electrode 116 is disposed on the gate insulating layer 143 and under an interlayer insulating layer 144. The source electrode 122 and the drain electrode 124 are disposed on the interlayer insulating layer 144.

The substrate 110 can include a foldable plastic material. For example, the substrate 110 can be formed of one of PI (Polyimide), PET (polyethylene terephthalate), PEN (polyethylene naphthalate), PC (polycarbonate), PES (polyethersulfone), PAR (polyarylate), PSF (polysulfone), and COC (cyclic-olefin copolymer). The substrate 110 of the present specification is not limited to this material, but can be made of a transparent material such as foldable thin glass or hard glass.

The buffer layer 142 serves to protect the TFT formed from impurities such as alkali ions leaking from the first substrate 110 or to block outer moisture. The buffer layer 142 can be a single layer made of silicon oxide (SiOx) or silicon nitride (SiNx) or a multilayer thereof. However, it is not limited thereto.

The semiconductor layer 114 can be made of an amorphous semiconductor material such as amorphous silicon (a-Si), a crystalline semiconductor material such as polysilicon (p-Si), or an oxide semiconductor such as indium gallium zinc oxide (IGZO). In this case, the semiconductor layer 114 includes a channel region **114*a* in a center and a source region 114*b* and a drain region 114*c*** as a doping region at both sides.

The gate electrode 116 can be formed of a single layer or a plurality of layers made of a metal such as Cr, Mo, Ta, Cu, Ti, Al, or an Al alloy, but it is not limited thereto.

The interlayer insulating layer 144 can be formed of an organic material, e.g., photo-acryl, and/or an inorganic material, e.g., SiNx or SiOx and can have a single layer or a plurality of layers. The interlayer insulating layer 144 can have a multi-layered structure including at least one organic material layer and at least one inorganic material layer.

The source electrode 122 and the drain electrode 124 can be formed of a single layer or a plurality of layers made of a metal such as Cr, Mo, Ta, Cu, Ti, Al, or an Al alloy, but it is not limited thereto.

The source electrode 122 and the drain electrode 124 respectively have an ohmic contact to the source region **114*b* and the drain region 114*c* of the semiconductor layer 114 though a first contact hole 149*a* and a second contact hole 149*b* formed in the gate insulating layer 143 and the interlayer insulating layer 144**.

A lower shield metal layer can be disposed on the substrate 110 under the semiconductor layer 114. The lower shield metal layer can minimize a back channel phenomenon caused by charges trapped in the substrate 110 to prevent an afterimage or deterioration of the transistor performance. The lower shield metal layer can be formed of at least one of Ti, Mo and Ti—Mo alloy and can have a single-layered structure or a multi-layered structure. However, it is not limited thereto.

A passivation layer 146 is formed on the substrate 110 on which the thin film transistor T is disposed. The passivation layer 146 can be formed of an organic material such as photo-acryl, but it is not limited thereto. The passivation layer 146 can include a plurality of layers including an inorganic layer and an organic layer. A third contact hole **149*c* is formed in the passivation layer 146**.

A first electrode 132, which is electrically connected to the drain electrode 124 of the thin film transistor T through the third contact hole **149*c*, is formed on the passivation layer 146 and in each of the sub-pixels SP1 and SP2. The first electrode 132 is a reflective electrode. For example, the first electrode 132 can include a transparent conductive material layer, which is formed of a transparent conductive material, e.g., indium tin oxide (ITO) or indium zinc oxide (IZO), and a reflective conductive material layer, which is being formed of silver (Ag) or aluminum-palladium-copper (APC) alloy. In this instance, the first electrode 132 can have a triple-layered structure of ITO/Ag/ITO or ITO/APC/ITO. Alternatively, the first electrode 132 can include a metallic material such as Ca, Ba, Mg, Al, Ag, or their alloys and can have a single-layered structure or a multi-layered structure. The first electrode 132 is connected to the drain electrode 124 of the thin film transistor T, and an image signal is applied to the first electrode 132. The first electrode 132** is one of an anode and a cathode.

A bank layer 152 is disposed at a boundary between each sub-pixel SP and on the passivation layer 146. The bank layer 152 is a type of barrier wall defining the sub-pixels SP1 and SP2. Each of the sub-pixels SP1 and SP2 is partitioned by the bank layer 152 so that color mixing between adjacent sub-pixel SP can be prevented.

A light emitting layer 134 is formed on the first electrode 132 and on a partial region of the inclined surface of the bank layer 152. The light emitting layer 134 can include an R-light emitting layer, which is formed in the red sub-pixel to emit red light, a G-light emitting layer, which is formed in the green sub-pixel to emit green light, and a B-light emitting layer, which is formed in the blue sub-pixel to emit blue light. In addition, the light emitting layer 134 can further include a W-light emitting layer emitting white light. The light emitting layer 134 can be an organic light emitting layer. However, it is not limited thereto, and the light emitting layer 134 can be an inorganic light emitting layer, a quantum dot light emitting layer or a micro-LED layer.

Each organic light emitting layer 134 includes a light emitting layer, e.g., an emitting material layer, a hole injection layer, a hole transporting layer, an electron blocking layer, a hole blocking layer, an electron transporting layer and an electron injection layer. The hole and the electron are injected toward the light emitting layer by the hole injection layer and the electron injection layer and are transported into the light emitting layer by the hole transporting layer and the electron transporting layer.

A second electrode 136 is formed on the light emitting layer 134. The second electrode 136 is a transparent electrode (or a semi-transparent electrode). The second electrode 136 can include a metallic material such as Ca, Ba, Mg, Al, Ag, or their alloys and have a thin profile to transmit a visible light. Alternatively, the second electrode 136 can include a transparent conductive material, e.g., ITO or IZO. The second electrode 136 is the other one of the anode and the cathode.

The first electrode 132, the light emitting layer 134 and the second electrode 136 constitute the light emitting element E and emits light having an intended wavelength according to the applied signal.

An encapsulation layer 160 is formed on the second electrode 136. The encapsulation layer 160 can include a first encapsulation layer 162 of an inorganic material, a second encapsulation layer 164 of an organic material, and a third encapsulation layer 166 of an inorganic material. The inorganic material can include at least one of SiNx and SiOx, but it is not limited thereto. The organic material can include at least one of polyethylene terephthalate, polyethylene naphthalate, polycarbonate, polyimide, polyethylene sulfonate, polyoxymethylene, polyarylate, and their mixtures, but it is not limited thereto.

The color filter layer 192 is formed on the third encapsulation layer 166. The color filter layer 192 can include a red color filter, a green color filter and a blue color filter corresponding to respective sub-pixel.

The color filter layer 192 realizes R, G, and B colors by transmitting light of a corresponding wavelength among the light emitted from the light emitting element E and absorbing light of other wavelengths. When the light emitting layer 134 of the light emitting element E emits white light, R, G, and B colors can be realized by the color filter layer 192.

In addition, when the light emitting layer 134 of the light emitting element E emits monochromatic light, for example, light of R, G, and B colors, the R, G, and B color filter layers are formed in the sub-pixels SP1 and SP2 of the corresponding color, respectively. For example, the R color filter layer is disposed on the sub-pixel emitting red light, the G color filter layer is disposed on the sub-pixel emitting green light, and the B color filter layer is disposed on the sub-pixel emitting blue light. The color filter layer 192 filters the light of the corresponding color and provides light having a higher purity color.

A planarization layer 195 is formed on the color filter layer 192, and a cover window 196 is disposed on the planarization layer 195. The planarization layer 195 can be formed of an organic material such as photo-acryl, and the cover window 196 can be formed of transparent glass or a film. When the cover window 196 is formed of a film, a PET (polyethylene terephthalate) film can be used but it is not limited thereto. When the cover window 196 is formed of glass, thin glass having a thickness of several tens of m can be used.

In the display device 100 according to the embodiment of the present disclosure, the light control layer is formed inside the second encapsulation layer 164 to control the output of light, which is input from the outside and diffusely reflected by the thin film transistor T or the electrode, so that the image quality defect is prevented.

For example, in the display device 100 according to the embodiment of the present disclosure, a reactive liquid crystal monomer 168 and a dichroic dye 169 are included in the second encapsulation layer 164, and the dichroic dye 169 presented in a boundary region of the sub-pixels SP1 and SP2 is converted to black. As a result, the reflected light from corresponding sub-pixel, e.g., the sub-pixel SP1, is absorbed by the dichroic dye 169 in the boundary region so that the penetration of the reflected light toward adjacent sub-pixel, e.g., the sub-pixel SP2, can be prevented. The dichroic dye 169 in the boundary region or a portion of the second encapsulation layer 164 in the boundary region acts as the light control layer. Namely, the dichroic dye 169 in the boundary region has a black color to absorb light.

The reactive liquid crystal monomer 168 acts as a host, and the dichroic dye 169 acts as a guest. The reactive liquid crystal monomer 168 is a liquid crystal material including a polymerizable terminal group and includes a mesogen expressing a liquid crystal property (or liquid crystallinity) and the polymerizable terminal group. Accordingly, when the reactive liquid crystal monomer 168 is aligned in a specific direction, the dichroic dye 169 is aligned along the reactive liquid crystal monomer 168.

Since the reactive liquid crystal monomer 168 has a smectic phase, the reactive liquid crystal monomer 168 is vertically aligned with the substrate 110. Accordingly, the dichroic dye 168 also follows the reactive liquid crystal monomer 168 to be vertically arranged with the substrate 110.

The reactive liquid crystal monomer 168 and the dichroic dye 169 can be distributed over the entire area of the substrate 110, e.g., the entire second encapsulation layer 164, and vertically aligned with the substrate 110. The dichroic dye 169 arranged in the boundary region of the sub-pixels SP1 and SP2 is converted to black, and the dichroic dye 169 arranged in the sub-pixels SP1 and SP2 is not converted to black.

Accordingly, in the boundary region of the sub-pixels SP1 and SP2, where the black dichroic dye 169 is vertically aligned with the substrate 110, the light incident to the boundary region of the sub-pixels SP1 and SP2 is absorbed by the black dichroic dye 169. Accordingly, since the light, which is emitted from the light emitting element E and incident on the boundary region of the sub-pixels SP1 and SP2, is absorbed by the black dichroic dye 169, the color mixing at the boundary region of the sub-pixels SP1 and SP2 can be prevented. For example, the black dichroic dye 169 can serve as a black matrix in the boundary region of the sub-pixels SP1 and SP2.

In addition, since the light, which is emitted from the light emitting element E of a specific sub-pixel, e.g., SP1, and output to an adjacent sub-pixel, e.g., SP2, is incident to the boundary region of the sub-pixels SP1 and SP2 with a predetermined angle, the light is incident to a side surface of the black dichroic dye 169 and is absorbed by the black dichroic dye 169. Accordingly, the color mixing in adjacent sub-pixels having different colors and the occurrence of spots due by the diffuse reflection can be prevented.

The dichroic dye 169 according to the present disclosure is converted to black by a photoreaction.

The dichroic dye 169 can be a photochromic dye. In Photochromism, that a chemical substance is reversibly denatured by absorption and blocking of light of a specific energy (a specific wavelength) so that the properties of the chemical substance are changed. The photochromic dye can have a characteristic of changing a color from an original color to another color, for example, from a transparent state to a black state, by light of a specific wavelength. The dichroic dye 168 according to the present disclosure can include diarylethene, spiropyran, azobenzene, spirooxazine, benzopyran, chromene and an azo compound, but it is not limited thereto.

In the display device 100 according to the embodiment of the present disclosure, by distributing the reactive liquid crystal monomer 168 and the dichroic dye 169 in the second encapsulation layer 164 of an organic material and converting the dichroic dye 160 in the boundary of the sub-pixels SP1 and SP2 to black, the light control layer OC is provided in the second encapsulation layer 164. Since the light incident with a predetermined angle is absorbed by the vertically aligned black dichroic dye 169, the problem of the color mixing and/or the spot can be prevented.

Figure 4:
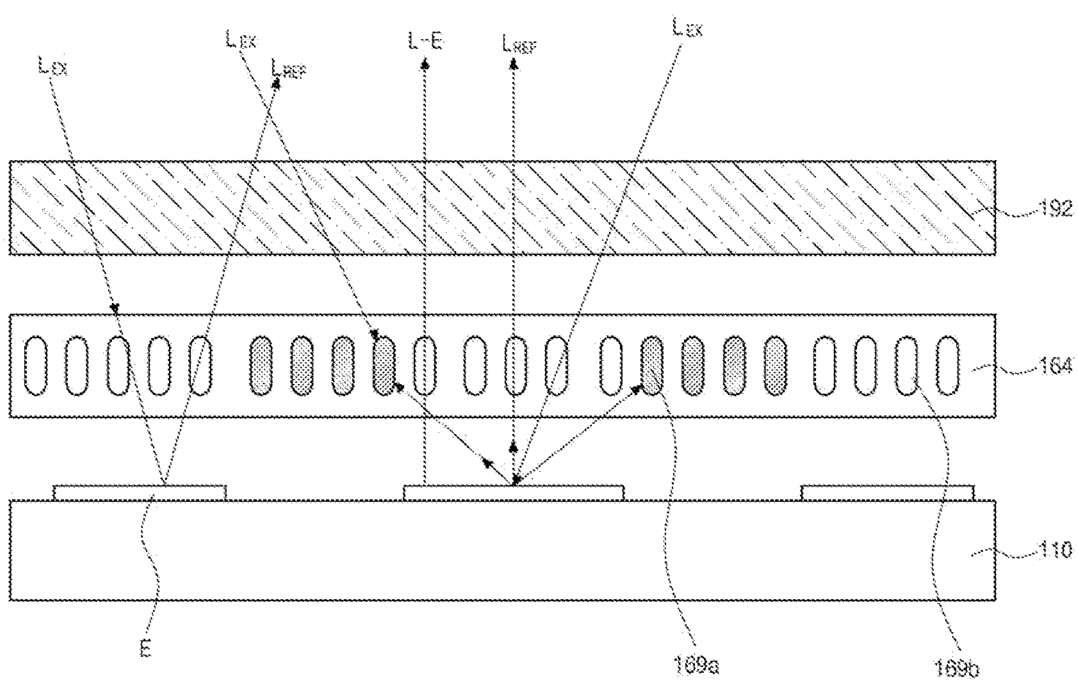
FIG. 4 is a view explaining the light blocking by a dichroic dye in the display device according to the first embodiment of the present disclosure.

FIG. 4 is a view explaining the light blocking by a dichroic dye in the display device according to the first embodiment of the present disclosure. For convenience of explanation, the dichroic dye without the reactive liquid crystal monomer is shown in FIG. 4.

Referring to FIG. 4, the light "L-E" emitted from the light emitting element E formed on the substrate 110 is incident on the color filter layer 192 through the second encapsulation layer 164, and a part of the light and the other part of the light are transmitted through and absorbed by the color filter layer 192, respectively. For example, when the light emitting element E emits white light, the light emitted from the light emitting element E passes through the R, G, and B color filter layers of the R, G, and B sub-pixels to output red light, green light, and blue light, respectively.

In addition, when the light emitting element E emits monochromatic light of red light, blue light, and green light, the red light, the green light and the blue light emitted from the light emitting element E pass through the R, G, and B color filter layers of the R, G, and B sub-pixels to output red light, green light, and blue light having a narrow bandwidth, respectively. As a result, the color purity is improved.

In the external light "LEX" toward the sub-pixel SP1 and SP2, a part is transmitted through the color filter layer 192, and the other part is absorbed by the color filter layer 192. The light passing through the color filter layer 192 is reflected by various layers, i.e., e.g., a metal layer such as a thin film transistor, a gate line and a data line, inside the display device 100 and is output to the outside of the display device 100. The external light is diffusely reflected inside the display device 100 and output in various directions.

The dichroic dye 169 is included throughout the inside of the second encapsulation layer 164 and is vertically aligned along the liquid crystal monomer to be perpendicular to the substrate 110. The dichroic dye 169*a* disposed in the boundary region of the sub-pixels SP1 and SP2 is converted to black by irradiation of light such as ultraviolet light, while the dichroic dye 169*b* disposed in the sub-pixels SP1 and SP2 maintains original state, e.g., transparent, without converting to black.

Since the light emitted from the light emitting element E and output to the sub-pixels SP1 and SP2 is incident on the unconverted dichroic dye 169*b*, the light passes through the color filter layer 192 to display the color on the screen without absorption by the dichroic dye 169*a*.

On the other hand, the light, which emitted from the light emitting element E and output to the boundary region of the sub-pixels SP1 and SP2, is incident on the dichroic dye 169*a*, which is converted to black, and is absorbed by the black dichroic dye 169*a* so that the penetration of the light from one sub-pixel into adjacent sub-pixel is prevented. Accordingly, the problem of the color mixing and/or the spot can be prevented.

Among the external light to the display device 100, most of the light to the boundary region of the sub-pixels SP1 and SP2 is absorbed by the black dichroic dye 169*a*, and only a small portion of the light is reflected from the inside of the display device 100 and output back to the outside. In the organic light emitting display device according to the present disclosure, the reflectance of the external light in the boundary region of the sub-pixel can be about 5% or less.

Among the external light to the display device 100, the light incident to the sub-pixels SP1 and SP2 is incident into the display device 100 and is diffusely reflected inside the display device 100. The light "LREF", which is diffusely reflected and output back through the sub-pixels SP1 and SP2 in a direction perpendicular to the substrate 110, passes through the unconverted dichroic dye 169*b* without being absorbed. On the other hand, the light, which is diffusely reflected and is obliquely output at a predetermined angle to the substrate 110, is incident on the boundary region of the sub-pixels SP1 and SP2 and is absorbed by the black dichroic dye 169*a*.

Accordingly, monochromatic light, e.g., red light, reflected from a specific sub-pixel is not output through an adjacent sub-pixel (e.g., G sub-pixel or B sub-pixel), so that the color mixing does not occur and the defect such as the spot or stain can be prevented.

In addition, since some of the light diffusely reflected is absorbed by the black dichroic dye 169*a*, in comparison to an organic light emitting display device without the light control layer, the display device of the present disclosure with the light control layer have reduced ambient light reflection and improved visibility.

According to the present disclosure, in the case of a structure in which only the color filter 192 is formed on the encapsulation layer 160 without the light control layer, the reflectance of the external light (e.g., the ambient light reflection) in the sub-pixel is 30%. However, in the case of the structure in which the light control layer is formed inside the second encapsulation layer 164, the reflectance of external light is reduced to 24%. Namely, providing the light control layer inside the second encapsulation layer 164, visibility of the display device 100 can be further improved.

FIGS. 5A to 5E are cross-sectional views showing a fabricating process of a display device according to the first embodiment of the present disclosure.

Figure 5A:
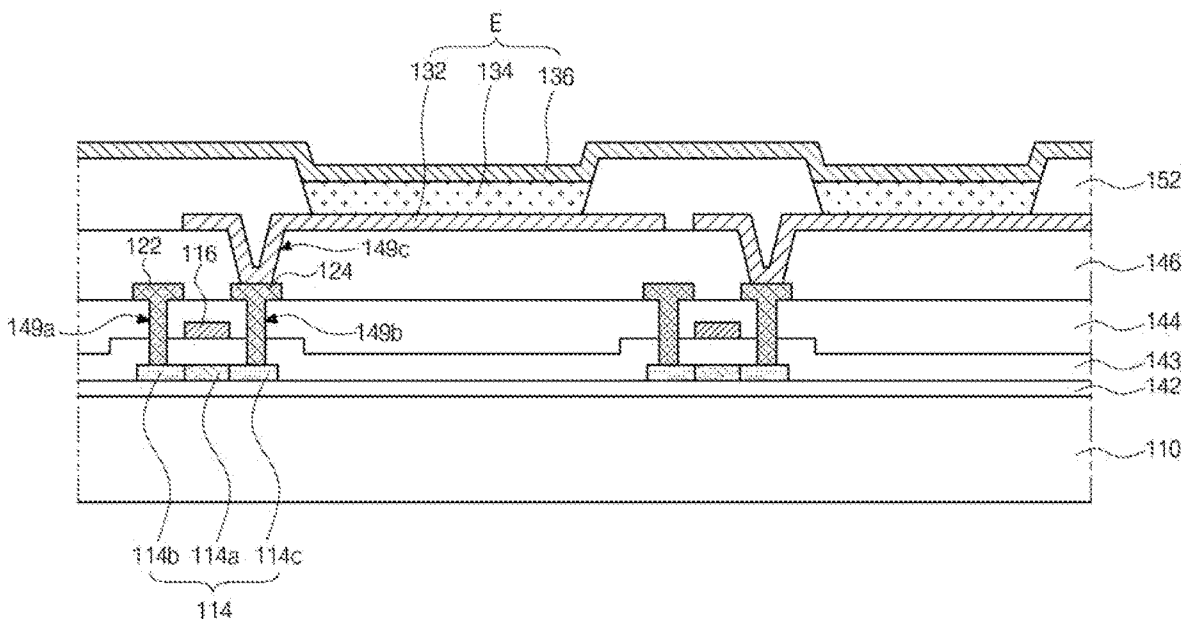
FIGS. 5A to 5E are cross-sectional views showing a fabricating process of a display device according to the first embodiment of the present disclosure.

As shown in FIG. 5A, an inorganic material such as SiOx or SiNx is stacked as a single layer or a plurality of layers on a substrate 110, which is formed of a flexible material such as plastic, by a chemical vapor deposition (CVD) method to form a buffer layer 142.

Next, a semiconductor material layer of a semiconductor material is stacked and etched to form the semiconductor layer 114 on the buffer layer 142. For example, the semiconductor material is one of an amorphous semiconductor, e.g., amorphous silicon, a crystalline semiconductor, e.g., polysilicon, and an oxide semiconductor, e.g., IGZO. The impurities are doped into both sides of the semiconductor layer 114 to form the source and drain regions 114*b* and 114*c*. A center of the semiconductor layer 114 is defined as the channel region 114*a*.

Next, an inorganic material, e.g., SiOx or SiNx, is deposited as a single layer or multi-layers by the CVD method to form the gate insulating layer 143 on the semiconductor layer 114. A metal is deposited and etched to form the gate electrode 116 on the gate insulating layer 143.

An amorphous semiconductor, e.g., amorphous silicon, a crystalline semiconductor, e.g., polycrystalline silicon, or an oxide semiconductor, e.g., IGZO, is stacked and etched to form the semiconductor layer 114 on the buffer layer 142. At this time, both sides of the semiconductor layer 114 are doped with impurities to form a channel region 114*a*, a source region 114*b*, and a drain region 114*c* for a transistor T.

Next, an organic material layer is stacked to form the interlayer insulating layer 144. Then, a portion of the gate insulating layer 143 and the interlayer insulating layer 144 corresponding to the source and drain regions 114*b* and 114*c* of the semiconductor layer 114 is etched to form the first and second contact holes 149*a* and 149*b*. Next, a metal is deposited and etched to form the source electrode 122 and the drain electrode 124. As a result, the transistor T is formed.

The source electrode 122 is connected to the source region 114*b* of the semiconductor layer 114 through the first contact hole 149*a*, and the drain electrode 124 is connected to the drain region 114*c* of the semiconductor layer 114 through the second contact hole 149*b*.

Next, an organic insulating material is stacked and etched to form the passivation layer 148 including the third contact hole 149*c*. Namely, the organic insulating material layer is etched to form the third contact hole 149*c* exposing the drain electrode 124 of the transistor T. Next, a transparent conductive material, e.g., ITO or IZO, is deposited and etched to form the first electrode 132 on the passivation layer 146. The first electrode 132 is electrically connected to the drain electrode 124 of the transistor T through the third contact hole 149*c*.

Next, the bank layer 152 including an opening is formed on the passivation layer 146. The bank layer 152 covers an edge of the first electrode 132 and exposes a center of the first electrode 132. The light emitting layer 134 is formed by coating an emitting material in the opening of the bank layer 152. Next, a metallic material is deposited with a thickness of several tens nanometers by a sputtering method and etched to form the second electrode 136 on the light emitting layer 134.

Figure 5B:
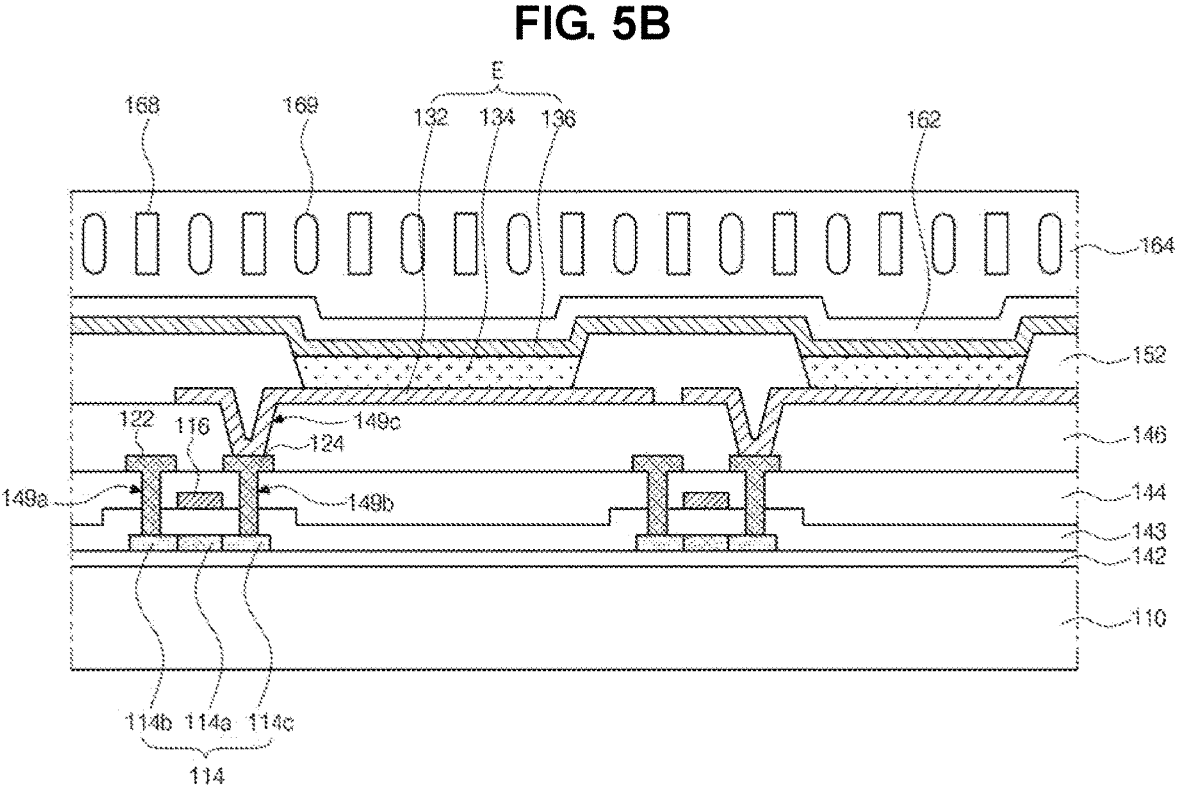

Next, as shown in FIG. 5B, an inorganic material, e.g., SiOx or SiNx, is deposited by the CVD method to form the first encapsulation layer 162 on the first electrode 132. Next, an organic material with the liquid crystal monomer 168 and the dichroic dye 169 is coated to form the second encapsulation layer 164. The organic material can include at least one of polyethylene terephthalate, polyethylene naphthalate, polycarbonate, polyimide, polyethylene sulfonate, polyoxymethylene, polyarylate, and their mixtures, but it is not limited thereto.

Since the liquid crystal monomer 168 is a smectic liquid crystal, the liquid crystal monomer 168 is vertically aligned with the substrate 110. Accordingly, the dichroic dye 168 is aligned to be parallel to the reactive liquid crystal monomer 168 and to be vertically arranged with the substrate 110.

Figure 5C:
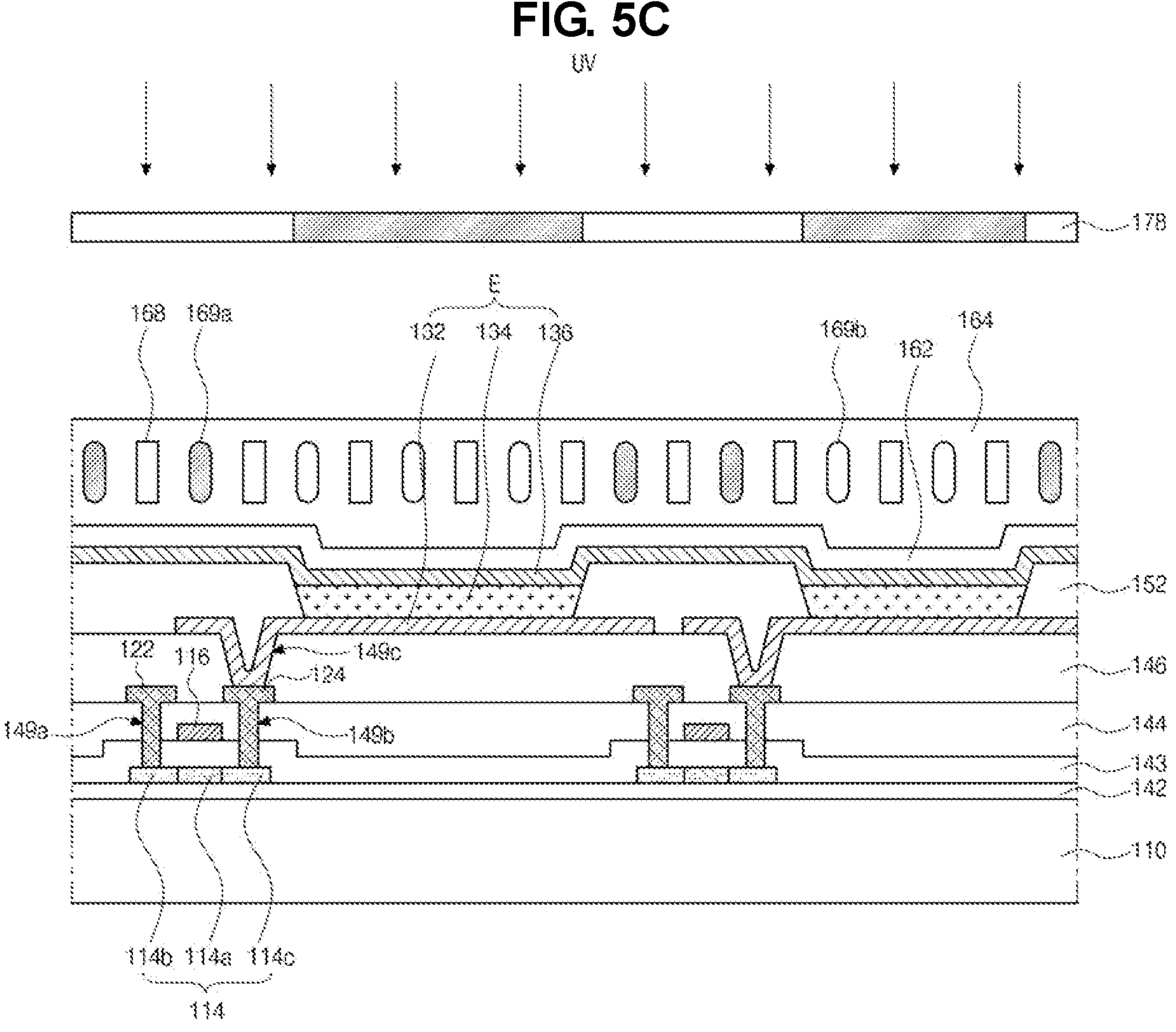

Next, as shown in FIG. 5C, after a mask 178 is disposed over the second encapsulation layer 164, a light, e.g., UV, is irradiated. The light is selectively irradiated to the second encapsulation layer 164 by the mask 178, and the dichroic dye 169*a* in a set region, for example, a boundary region between sub-pixels, is converted to black by the irradiation of the light. On the other hand, the dichroic dye 169*b* in the region not irradiated with the light is not converted to black. Then, the second encapsulation layer 164 is thermally cured. For example, the mask 178 can be same as a mask for forming the bank layer 152 so that the production cost can be reduced. Namely, a negative photo-sensitive material can be used for the bank layer 152, and the same mask can be used for forming the bank layer 152 and irradiating the light into the dichroic dye 169*b*.

Figure 5D:
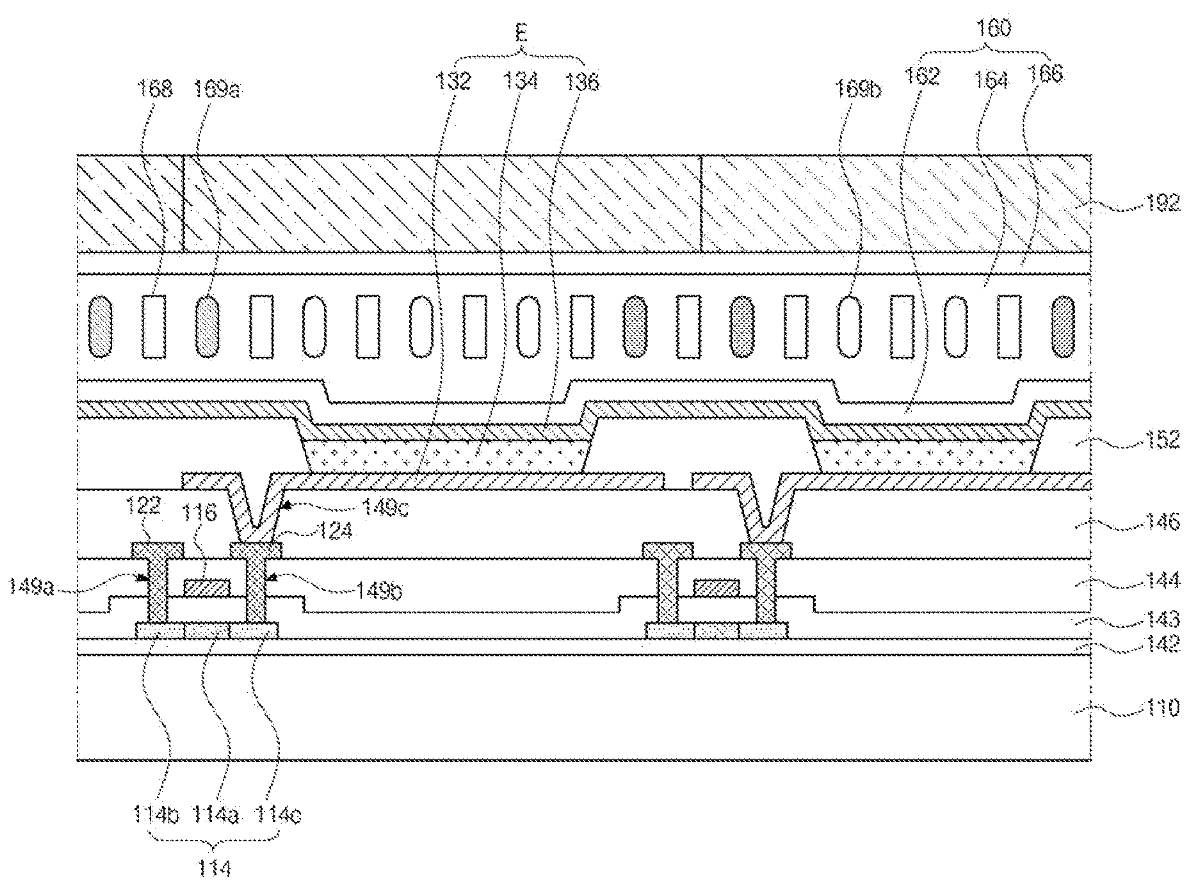

Next, as shown in FIG. 5D, an inorganic material, e.g., SiOx or SiNx, is deposited by the CVD method to form the third encapsulation layer 166 on the second encapsulation layer 164. Then, a dye or a pigment is coated to form the color filter layer 192 including the R, G and B color filters on the third encapsulation layer 166.

Figure 5E:
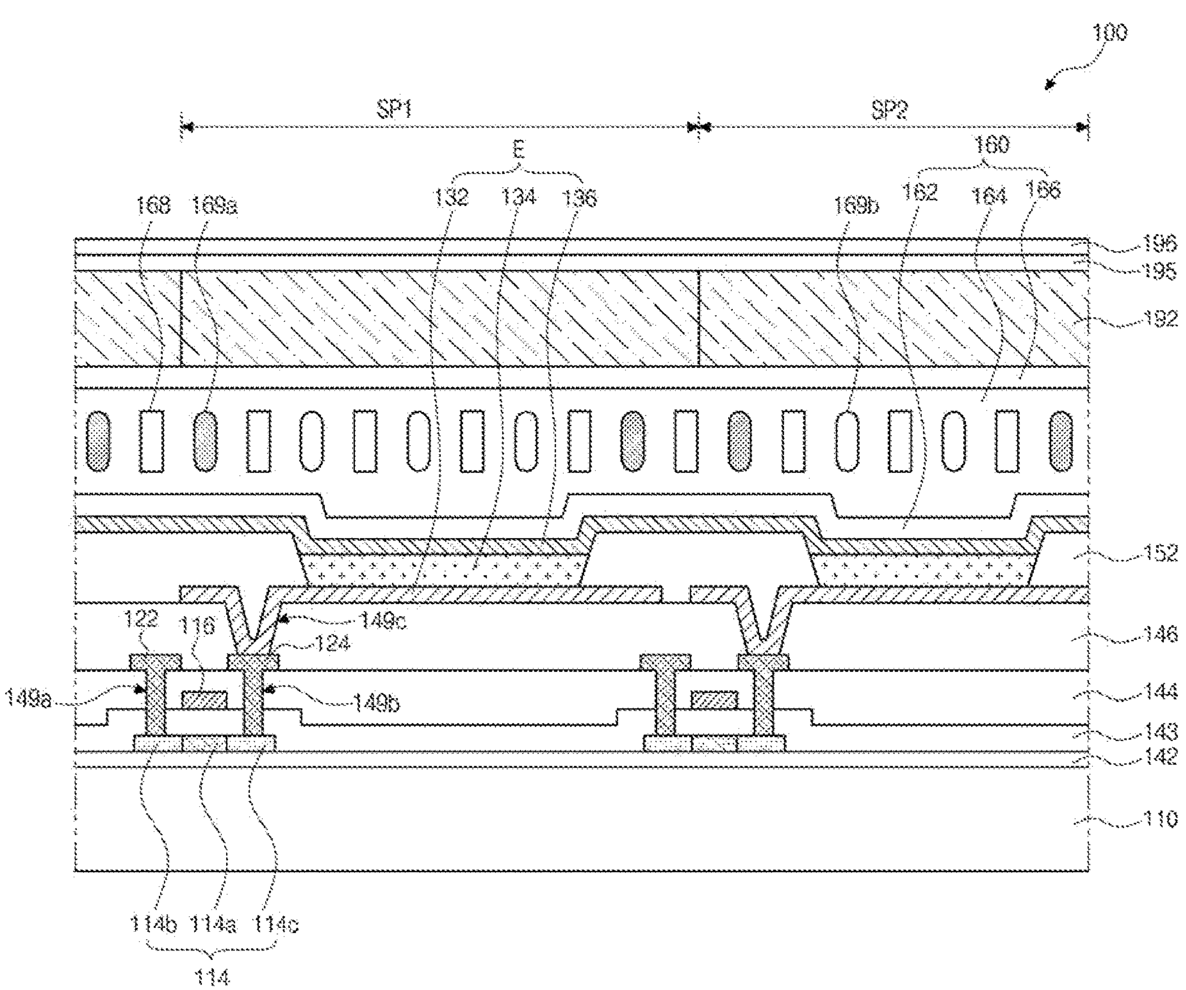

Next, as shown in FIG. 5E, an organic material such as photo-acryl is stacked to form the planarization layer 195 on the color filter layer 192, and the cover window 196, which is a transparent film of PET or glass, is attached to the planarization layer 195 using a transparent adhesive layer such as an optical clearance resin or an optical clearance adhesive. As a result, the display device 100 according to the present disclosure is manufactured.

In the display device 100 according to the embodiment of the present disclosure, since the color filter layer 192 is disposed on the encapsulation layer 160, the ambient light reflection can be reduced or minimized without having a polarizing plate. Accordingly, the visibility of the display device 100 is improved, the thickness of the display device 100 is reduced or minimized, and the manufacturing cost is reduced.

In addition, in the display device 100 according to the embodiment of the present disclosure, since the black dichroic dye 169*a* is disposed in the boundary region between adjacent sub-pixels, the light from one sub-pixel toward adjacent sub-pixel is prevented so that the problem of the color mixing and the spot (or stain) is prevented.

Figure 6:
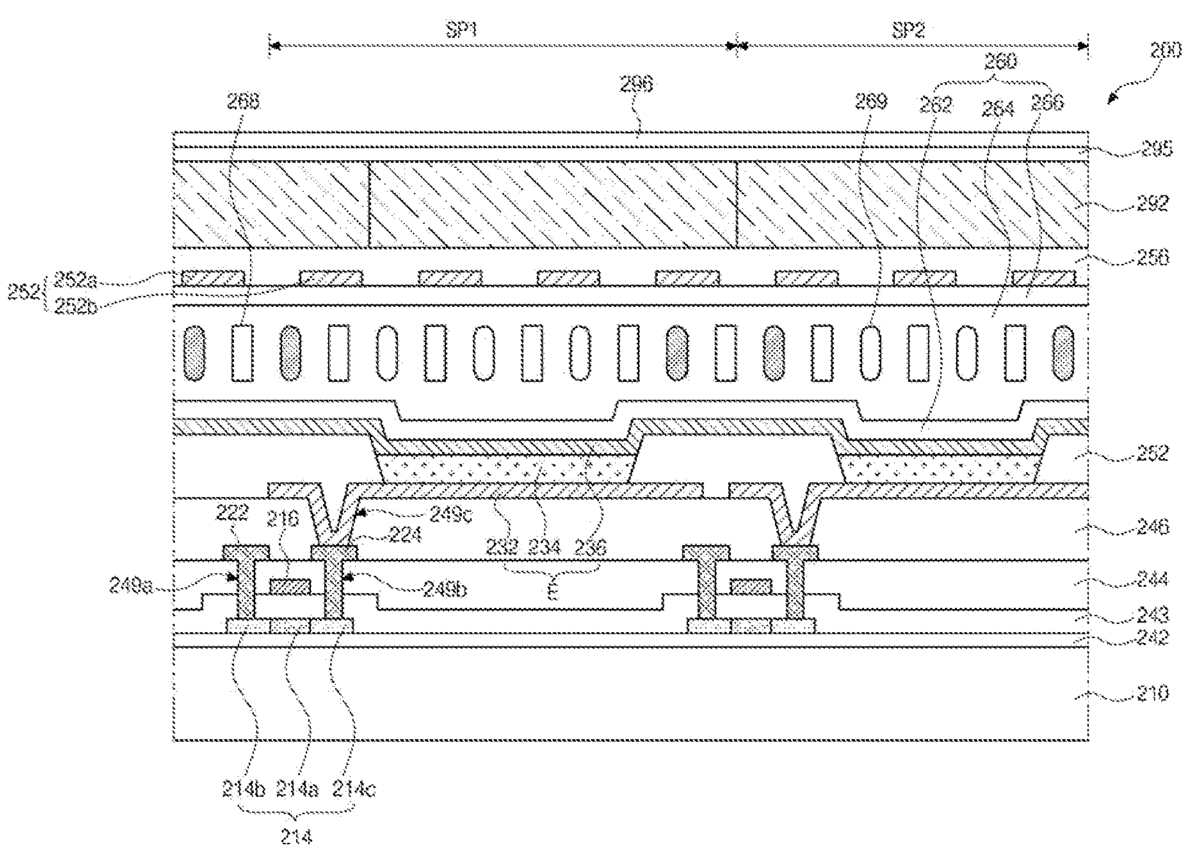
FIG. 6 is a cross-sectional view of a display device according to a second embodiment of the present disclosure.

FIG. 6 is a cross-sectional view of a display device according to a second embodiment of the present disclosure. The same element as the embodiment shown in FIG. 3 will be omitted or simplified, and the description is focused on other elements.

As shown in FIG. 6, in a display device 200, the thin film transistor T and the light emitting element E are disposed on or over the substrate 210, and the encapsulation layer 260 is disposed on or over the light emitting element E. The encapsulation layer 260 can include a first encapsulation layer 262 of an inorganic material, a second encapsulation layer 264 of an organic material, and a third encapsulation layer 266 of an inorganic material.

A touch sensor 252 is disposed on the encapsulation layer 260. This structure, where the touch sensor 252 is disposed directly on the encapsulation layer 260, can be referred to as a TOE (touch sensor on thin film encapsulation) structure.

In the TOE structure display device, since the touch sensor 252 is formed directly on the encapsulation layer 260 without an additional base film, e.g., a substrate for a touch panel, a thickness of the display device 200 and the production cost of the display device 200 can be decreased. In addition, since an attaching process of the touch panel and the display panel is not required, the fabricating process of the display device 200 can be simplified.

Moreover, since the touch sensor 252 is formed directly on the encapsulation layer 260 including a thin inorganic layer or a thin organic layer, the flexibility of the display device 200 can be secured.

The touch sensor 252 includes a plurality of first touch electrodes 252*a* and a plurality of second touch electrodes 252*b*. The plurality of first touch electrodes 252*a* are disposed along a first direction to be electrically connected to each other, and the plurality of second touch electrodes 252*b* are disposed along a second direction, which is perpendicular to the first direction, to be electrically connected to each other.

Each of the first and second touch electrodes 252*a* and 252*b* can have a triangular shape, a rectangular shape, a diamond shape or a polygonal shape in a plan, but it is not limited thereto. Each of the first and second touch electrodes 252*a* and 252*b* can have various other shapes.

A bridge can be formed between the adjacent first touch electrodes 252*a* to electrically connect the plurality of first touch electrodes 252*a* adjacent to each other in the vertical direction. A connection pattern can be formed between adjacent second touch electrodes 252*b* to electrically connect the plurality of first touch electrodes 252*a* adjacent to each other in the horizontal direction.

The first touch electrode 252*a* and the second touch electrode 252*b* are formed of a transparent metal oxide such as indium tin oxide (ITO) and indium zinc oxide (IZO), but it is not limited thereto. The first touch electrode 252*a* and the second touch electrode 252*b* can be formed of various materials.

A second interlayer insulating layer 256 is formed on the touch sensor 252. The second interlayer insulating layer 256 can be formed of an inorganic material such as SiOx or SiNx. The second interlayer insulating layer 256 can include a single layer or a plurality of layers of an inorganic layer and an organic layer, but it is not limited thereto.

The color filter layer 292 is formed on the second interlayer insulating layer 256, and the planarization layer 295 is formed on the color filter layer 292. The cover window 296 is disposed on the planarization layer 295.

The second encapsulation layer 264 of an organic material includes the reactive liquid crystal monomer 268 and the dichroic dye 269, and the dichroic dye 269 in the boundary region of the sub-pixel is converted to black by irradiation of light, e.g., UV.

Accordingly, in the display device 200 according to the second embodiment of the present disclosure, the external light diffusely reflected toward adjacent sub-pixel is absorbed by the black dichroic dye 269 so that the defect of the color mixing can be prevented.

Figure 7:
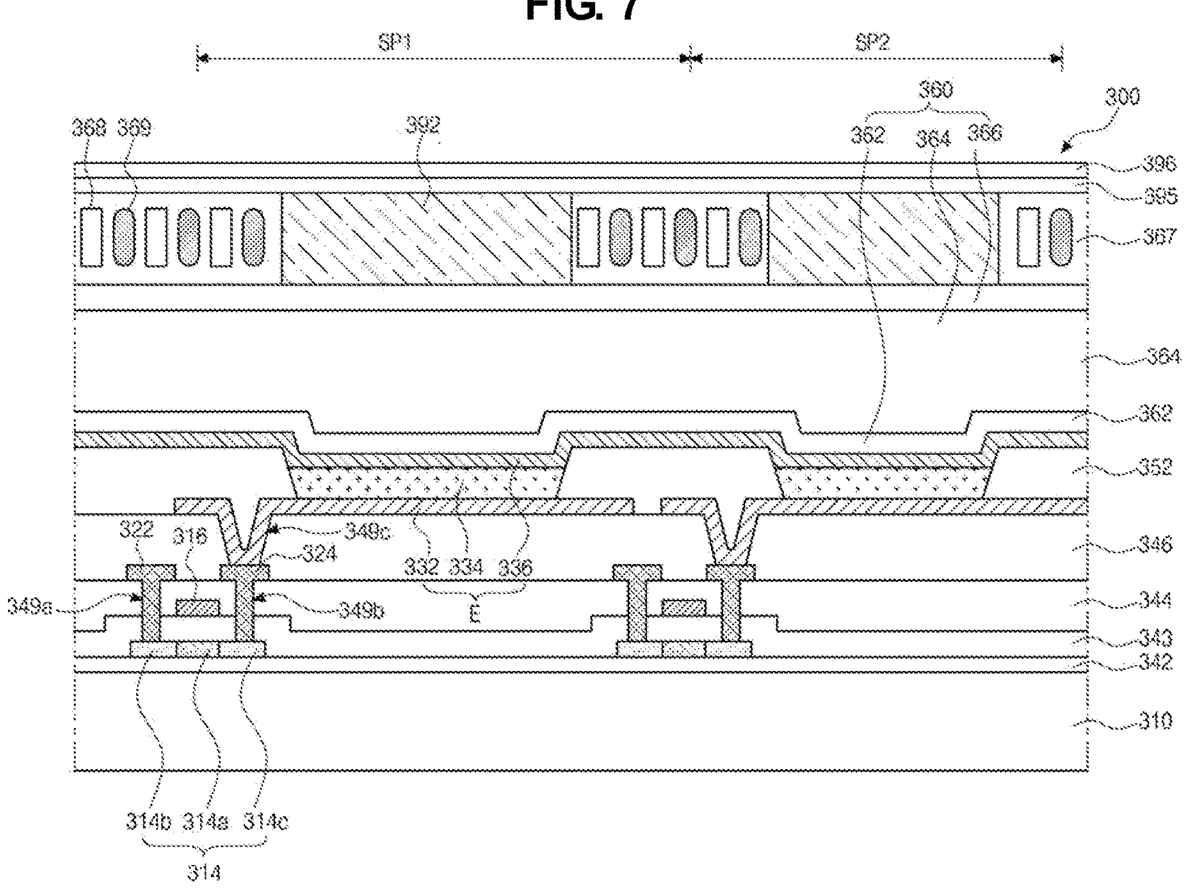
FIG. 7 is a cross-sectional view of a display device according to a third embodiment of the present disclosure.

FIG. 7 is a cross-sectional view of a display device according to a third embodiment of the present disclosure. The same element as the embodiment shown in FIG. 3 will be omitted or simplified, and the description is focused on other elements.

As shown in FIG. 7, in a display device 300, the thin film transistor T and the light emitting element E are disposed on or over the substrate 310 including the plurality of sub-pixels SP1 and SP2, and the encapsulation layer 360 is disposed on or over the light emitting element E. The encapsulation layer 360 can include a first encapsulation layer 362 of an inorganic material, a second encapsulation layer 364 of an organic material, and a third encapsulation layer 366 of an inorganic material.

In the display device of FIG. 3 and FIG. 6, the reactive liquid crystal monomer and the dichroic dye are included in the second encapsulation layer. However, in the display device 300, the reactive liquid crystal monomer 368 and the dichroic dye 369 are not included in the second encapsulation layer 364.

The color filter layer 392 is formed on the encapsulation layer 360. The color filter layer 392 can include R, G and B color filters, but it is not limited thereto. For example, the color filter layer 392 can include R, G, B, W color filters.

A light control layer 367 is disposed between adjacent color filters in the color filter layer 392, i.e., adjacent color filters. For example, the light control layer 367 is disposed at a boundary of the sub-pixels SP1 and SP2. The light control layer 367 includes a dichroic dye 369 in a liquid crystal layer. A reactive liquid crystal monomer 368 of the liquid crystal layer acts as a host, and the dichroic dye 369 acts as a guest. The dichroic dye 369 as the guest is aligned along the reactive liquid crystal monomer 368 as the host.

The dichroic dye 369 is a photoreactive dye and is converted to black as light such as ultraviolet light is irradiated. In addition, the dichroic dye 369 is vertically aligned with the substrate 310 along the liquid crystal monomer 368 of the smectic phase.

In the display device 300 according to the third embodiment of the present disclosure, the color filters of different colors in the color filter layers 392 are formed to be spaced apart from each other by a predetermined distance. A material layer including the liquid crystal monomer 368 and unconverted dichroic dye is formed between the color filter layers 392, and the light, e.g., UV, is irradiate so that the unconverted dichroic dye is converted to black dichroic dye 369. As a result, the light control layer 367 including the liquid crystal monomer 368 the dichroic dye 369 is formed between the color filters in the color filter layer 392.

Accordingly, the light emitted from the light emitting element E in one sub-pixel toward adjacent sub-pixel can be absorbed by the light control layer 367.

In addition, since the external light corresponding to each wavelength is primarily absorbed by the color filter layer 392, the reflection can be reduced. Since the external light incident to the boundary region of the sub-pixels SP1 and SP2 is absorbed by the black dichroic dye 369 of the light control layer 367, the light reflection in the boundary region of the sub-pixels SP1 and SP2 can be prevented.

The external light incident into the display device 300 is diffusely reflected by the lines or the electrodes inside the display device 300 and is output to the outside of the display device 300. The light, which is diffusely reflected and output in a direction perpendicular to the substrate 310, is directly output through the corresponding sub-pixels SP1 and SP2. On the other hand, the light, which is incident toward adjacent sub-pixel with a predetermined angle with respect to the substrate 310, is absorbed by the black dichroic dye 369 of the light control layer 367. As a result, the color mixing and the occurrence of spot by the diffusely reflected light can be prevented.

The planarization layer 395 is formed on the color filter layer 392, and the cover window 396 is disposed on the planarization layer 395. In the display device 300 according to the third embodiment of the present disclosure, a touch sensor can be disposed on the color filter layer 392.

Figure 8:
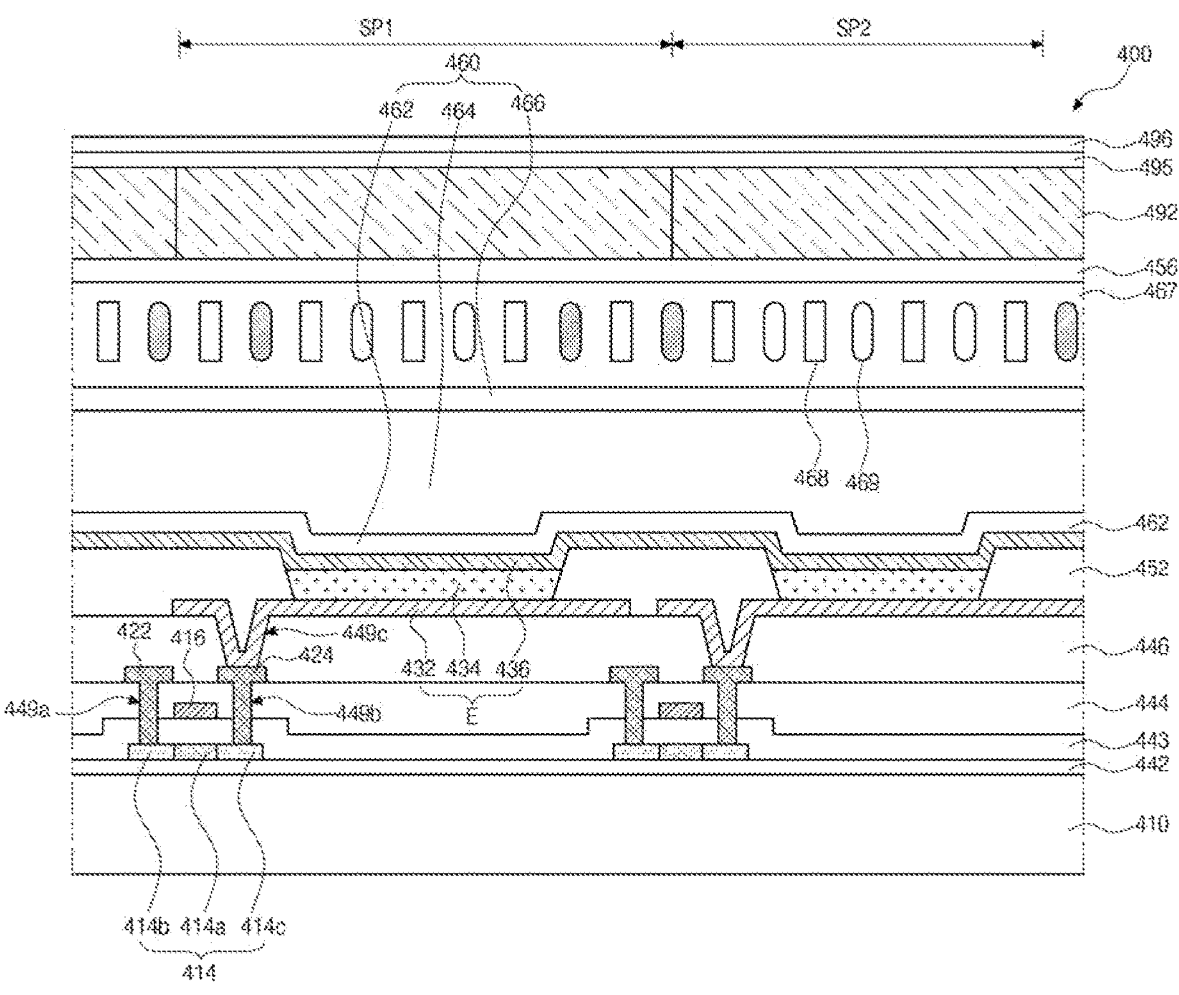
FIG. 8 is a cross-sectional view of a display device according to a fourth embodiment of the present disclosure.

FIG. 8 is a cross-sectional view of a display device according to a fourth embodiment of the present disclosure. The same element as the embodiment shown in FIG. 3 will be omitted or simplified, and the description is focused on other elements.

As shown in FIG. 8, in a display device 400, the thin film transistor T and the light emitting element E are disposed on or over the substrate 410 including the plurality of sub-pixels SP1 and SP2, and the encapsulation layer 460 is disposed on or over the light emitting element E. The encapsulation layer 460 can include a first encapsulation layer 462 of an inorganic material, a second encapsulation layer 464 of an organic material, and a third encapsulation layer 466 of an inorganic material.

A light control layer 467 is disposed on the third encapsulation layer 466. The light control layer 467 includes a dichroic dye 469 in a liquid crystal layer. A reactive liquid crystal monomer 468 of the liquid crystal layer acts as a host, and the dichroic dye 469 acts as a guest. The dichroic dye 469 as the guest is aligned along the reactive liquid crystal monomer 468 as the host.

As the reactive liquid crystal monomer 468 as the smectic liquid crystal is applied on the substrate 410, it is vertically aligned with the surface of the substrate 410. In addition, the dichroic dye 469 as the guest is aligned to be perpendicular to the surface of the substrate 410.

In the display device 400 according to the fourth embodiment of the present disclosure, the light control layer 467 including the reactive liquid crystal monomer 468 and the dichroic dye 469 is formed on the third encapsulation layer 466, and the light, e.g., UV, is irradiated into a portion of the light control layer 467 corresponding to the boundary of the sub-pixels SP1 and SP2 with a mask. As a result, the dichroic dye 469 in the boundary of the sub-pixels SP1 and SP2 is converted to black.

Accordingly, the light emitted from the light emitting element E in one sub-pixel toward adjacent sub-pixel can be absorbed by the light control layer 467.

In addition, since the external light incident to the boundary region of the sub-pixels SP1 and SP2 is absorbed by the black dichroic dye 469 of the light control layer 467, the light reflection in the boundary region of the sub-pixels SP1 and SP2 can be prevented.

The external light incident into the display device 400 is diffusely reflected by the lines or the electrodes inside the display device 400 and is output to the outside of the display device 400. The light, which is diffusely reflected and output in a direction perpendicular to the substrate 410, is directly output through the corresponding sub-pixels SP1 and SP2. On the other hand, the light, which is incident toward adjacent sub-pixel with a predetermined angle with respect to the substrate 410, is absorbed by the black dichroic dye 469 of the light control layer 467. As a result, the color mixing and the occurrence of spot by the diffusely reflected light can be prevented.

A second interlayer insulating layer 456 is formed on the light control layer 467, and the color filter layer 492 and the planarization layer 495 are formed on the second interlayer insulating layer 456. In addition, the cover window 496 is formed on the planarization layer 495. The interlayer insulating layer 456 can be formed of an inorganic material such as SiOx or SiNx, or a plurality of layers of an inorganic layer and an organic layer, but it is not limited thereto. The planarization layer 495 can be formed of an organic material such as photo-acryl, but it is not limited thereto. The color filter layer 492 can include R, G, and B color filters, but it is not limited thereto. For example, the color filter layer 492 can include R, G, B, and W color filters.

Figure 9:
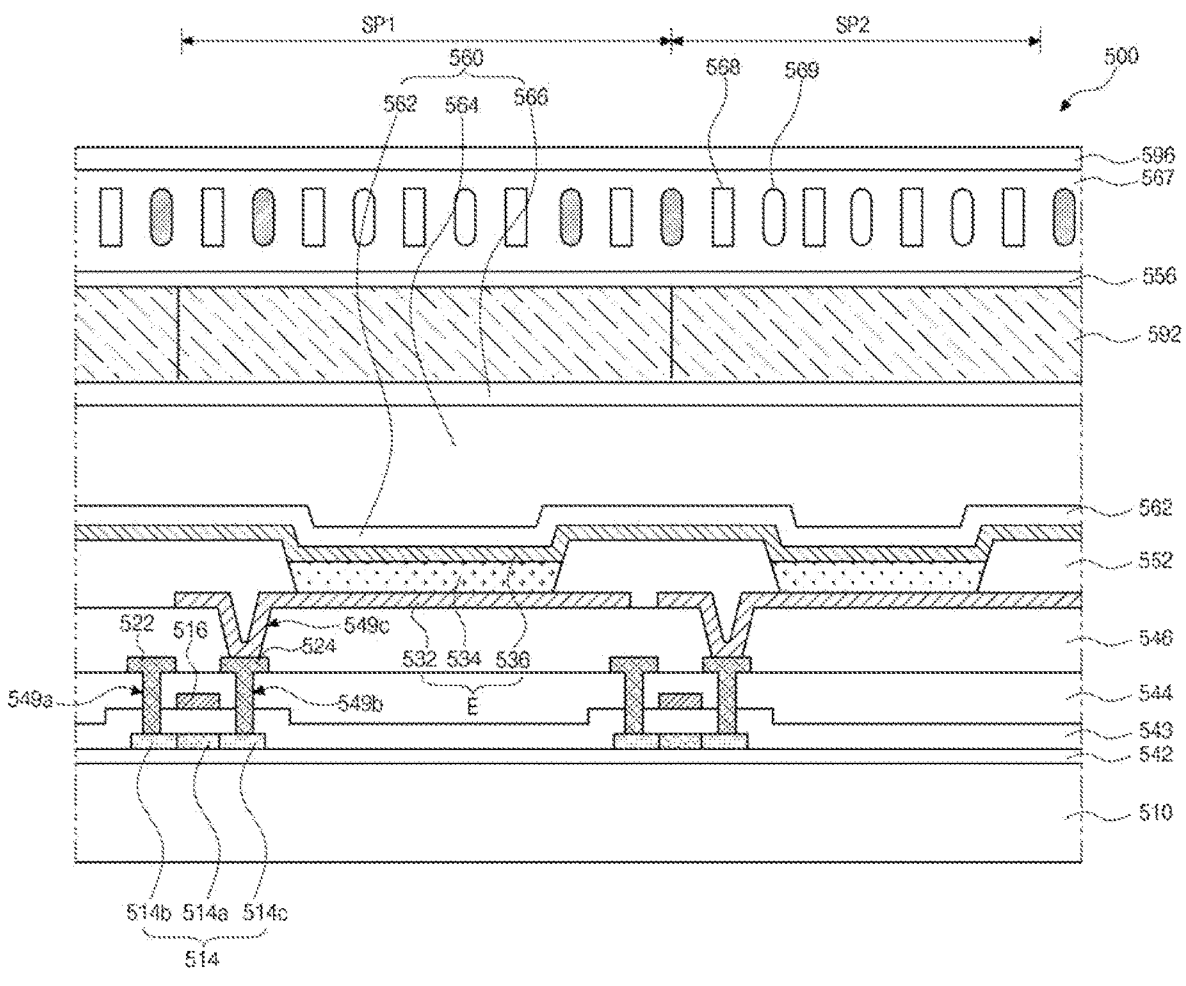
FIG. 9 is a cross-sectional view of a display device according to a fifth embodiment of the present disclosure.

FIG. 9 is a cross-sectional view of a display device according to a fifth embodiment of the present disclosure. The same element as the embodiment shown in FIG. 3 will be omitted or simplified, and the description is focused on other elements.

As shown in FIG. 9, in a display device 500, the thin film transistor T and the light emitting element E are disposed on or over the substrate 510 including the plurality of sub-pixels SP1 and SP2, and the encapsulation layer 560 is disposed on or over the light emitting element E. The encapsulation layer 560 can include a first encapsulation layer 562 of an inorganic material, a second encapsulation layer 564 of an organic material, and a third encapsulation layer 566 of an inorganic material.

The color filter layer 592 is disposed on the third encapsulation layer 566, and a second interlayer insulating layer 556 is disposed on the color filter layer 592. The color filter layer 592 can include R, G, and B color filters, but it is not limited thereto. For example, the color filter layer 592 can include R, G, B, and W color filters. The second interlayer insulating layer 556 can be formed of an inorganic material such as SiOx or SiNx, or a plurality of layers of an inorganic layer and an organic layer, but it is not limited thereto.

A light control layer 567 is formed on the second interlayer insulating layer 556, and the cover window 596 is disposed on the light control layer 567. The light control layer 567 includes a dichroic dye 569 in a liquid crystal layer. A reactive liquid crystal monomer 568 of the liquid crystal layer acts as a host, and the dichroic dye 569 acts as a guest. The dichroic dye 569 as the guest is aligned along the reactive liquid crystal monomer 568 as the host.

As the reactive liquid crystal monomer 568 as the smectic liquid crystal is applied on the substrate 510, it is vertically aligned with the surface of the substrate 510. In addition, the dichroic dye 569 as the guest is aligned to be perpendicular to the surface of the substrate 510.

In the display device 500 according to the fifth embodiment of the present disclosure, the light control layer 567 including the reactive liquid crystal monomer 568 and the dichroic dye 569 is formed on the second interlayer insulating layer 556, and the light, e.g., UV, is irradiated into a portion of the light control layer 567 corresponding to the boundary of the sub-pixels SP1 and SP2 with a mask. As a result, the dichroic dye 569 in the boundary of the sub-pixels SP1 and SP2 is converted to black.

Accordingly, the light emitted from the light emitting element E in one sub-pixel toward adjacent sub-pixel can be absorbed by the light control layer 567.

In addition, since the external light incident to the boundary region of the sub-pixels SP1 and SP2 is absorbed by the black dichroic dye 569 of the light control layer 567, the light reflection in the boundary region of the sub-pixels SP1 and SP2 can be prevented.

The external light incident into the display device 500 is diffusely reflected by the lines or the electrodes inside the display device 500 and is output to the outside of the display device 500. The light, which is diffusely reflected and output in a direction perpendicular to the substrate 510, is directly output through the corresponding sub-pixels SP1 and SP2. On the other hand, the light, which is incident toward adjacent sub-pixel with a predetermined angle with respect to the substrate 510, is absorbed by the black dichroic dye 569 of the light control layer 567. As a result, the color mixing and the occurrence of spot by the diffusely reflected light can be prevented.

The display device according to the embodiments of the present disclosure can be discussed as follows.

A display device according to the embodiments of the present disclosure comprises a substrate including a plurality of sub-pixels, a thin film transistor and a light emitting element on the substrate, an encapsulation layer on the substrate and covering the light emitting element, and a light control layer disposed on the light emitting element and including a liquid crystal monomer and a dichroic dye, wherein the dichroic dye in a boundary region between the sub-pixels has a black color to absorb a light.

In an embodiment of the present disclosure, the liquid crystal monomer and the dichroic dye can be vertically aligned with respect to the substrate.

In an embodiment of the present disclosure, the dichroic dye in the boundary region can be converted by a photoreaction to have the black color.

In an embodiment of the present disclosure, the encapsulation layer can include a first encapsulation layer, a second encapsulation layer on the first encapsulation layer, and a third encapsulation layer on the second encapsulation layer.

In an embodiment of the present disclosure, at least one of the first and third encapsulation layers can include an inorganic material.

In an embodiment of the present disclosure, the second encapsulation layer can include an organic material.

In an embodiment of the present disclosure, the light control layer can be included in the second encapsulation layer.

In an embodiment of the present disclosure, the liquid crystal monomer and the dichroic dye can be distributed in the second encapsulation layer.

In an embodiment of the present disclosure, wherein the dichroic dye in a region corresponding to the sub-pixels can be transparent.

In an embodiment of the present disclosure, the display device can further comprise a color filter layer disposed on the encapsulation layer.

In an embodiment of the present disclosure, the light control layer can be disposed between adjacent color filters of the color filter layer.

In an embodiment of the present disclosure, the light control layer can be disposed under the color filter layer.

In an embodiment of the present disclosure, the light control layer can be disposed on the color filter layer.

In an embodiment of the present disclosure, the display device can further comprise a touch sensor disposed on the encapsulation layer.

A method of fabricating a display device according to the embodiments of the present disclosure comprises preparing a substrate including a plurality of sub-pixels, forming a thin film transistor and a light emitting element on the substrate, forming an encapsulation layer on the light emitting element, forming a light control layer including a liquid crystal monomer and a dichroic dye, and irradiating a light to the light control layer in a boundary region between adjacent sub-pixels so that the dichroic layer is converted to black.

In the method according to an embodiment of the present disclosure, the step of forming the encapsulation layer and the step of forming the light control layer can include forming a first encapsulation layer by depositing an inorganic material on the light emitting element, forming a second encapsulation layer by coating an organic material including the liquid crystal monomer and the dichroic dye on the first encapsulation layer, and forming a third encapsulation layer by depositing an inorganic layer on the second encapsulation layer.

In the method according to an embodiment of the present disclosure, the method can further comprise forming a color filter layer on the encapsulation layer.

In the method according to an embodiment of the present disclosure, the light control layer can be formed between adjacent color filters of the color filter layer.

In the method according to an embodiment of the present disclosure, the light control layer can be formed on the color filter layer.

In the method according to an embodiment of the present disclosure, the light control layer can be formed on the encapsulation layer.

A display device according to the embodiments of the present disclosure comprises a substrate including a plurality of sub-pixels, a thin film transistor and a light emitting element on the substrate, an encapsulation layer on the substrate and covering the light emitting element, and a light control layer disposed on the light emitting element and including a liquid crystal monomer and a dichroic dye absorbing a light, wherein the display device does not comprise a polarizing plate.

A display device according to the embodiments of the present disclosure comprises a substrate including a plurality of sub-pixels, a thin film transistor and a light emitting element on the substrate, an encapsulation layer on the substrate and covering the light emitting element, and a light control layer disposed in a boundary region between every two sub-pixels among the plurality of sub-pixels and including a liquid crystal monomer and a dichroic dye serving as a black matrix.

It will be apparent to those skilled in the art that various modifications and variations can be made in the embodiments of the present disclosure without departing from the spirit or scope of the present disclosure. Thus, it is intended that the modifications and variations cover this disclosure provided they come within the scope of the appended claims and their equivalents.

What is claimed is:

1. A display device, comprising:

a substrate including a plurality of sub-pixels;

a thin film transistor and a light emitting element on the substrate;

an encapsulation layer on the substrate and covering the light emitting element, the encapsulation layer including a first encapsulation layer, a second encapsulation layer on the first encapsulation layer, and a third encapsulation layer on the second encapsulation layer; and liquid crystal monomers and dichroic dyes disposed within the second encapsulation layer, wherein the dichroic dyes in a boundary region between the sub-pixels have a black color.

2. The display device according to claim 1, wherein the liquid crystal monomers and the dichroic dyes are vertically aligned with respect to the substrate.

3. The display device according to claim 1, wherein the dichroic dyes in the boundary region are converted by a photoreaction to have the black color.

4. The display device according to claim 1, wherein at least one of the first and third encapsulation layers includes an inorganic material.

5. The display device according to claim 1, wherein the second encapsulation layer includes an organic material.

6. The display device according to claim 1, wherein the liquid crystal monomers and the dichroic dye are distributed in the second encapsulation layer.

7. The display device according to claim 6, wherein the dichroic dyes-dye in a region corresponding to the sub-pixels is transparent.

8. The display device according to claim 1, further comprising:

a color filter layer disposed on the encapsulation layer.

9. The display device according to claim 8, wherein the second encapsulation layer is disposed between adjacent color filters of the color filter layer.

10. The display device according to claim 8, wherein the second encapsulation layer is disposed under or on the color filter layer.

11. The display device according to claim 1, further comprising:

a touch sensor disposed on the encapsulation layer.

12. The display device of claim 1, wherein the display device excludes a polarizing plate.

13. The display device of claim 1, wherein the liquid crystal monomers and the dichroic dyes serve as a black matrix.

* * * * *